United States Patent [19]
Spadea

[11] 4,224,733
[45] Sep. 30, 1980

[54] ION IMPLANTATION METHOD
[75] Inventor: Gregorio Spadea, Saratoga, Calif.
[73] Assignee: Fujitsu Limited, Kawasaki, Japan
[21] Appl. No.: 840,793
[22] Filed: Oct. 11, 1977
[51] Int. Cl.² ............................................. B01J 17/00
[52] U.S. Cl. ..................................... 29/571; 29/578; 29/584; 148/1.5; 358/59; 357/91; 29/576 B
[58] Field of Search .......................... 29/571, 584, 578; 148/1.5; 357/59, 91

[56] References Cited
U.S. PATENT DOCUMENTS

| | | | |
|---|---|---|---|
| 3,330,696 | 7/1967 | Ullery | 29/584 |
| 3,558,366 | 1/1971 | Lepselter | 357/91 |
| 3,739,237 | 6/1973 | Shannon | 29/571 |
| 4,033,797 | 7/1977 | Dill | 357/59 |
| 4,075,754 | 2/1978 | Cook | 29/571 |

Primary Examiner—W. C. Tupman
Attorney, Agent, or Firm—David E. Lovejoy

[57] ABSTRACT

Ions are implanted into a body, such as semiconductor substrate material, through one or more covering layers formed over the body. A thin conductive film is in contact with the covering layer prior to the ion implantation. The ions are implanted into the material through the thin conductive film. The conductive film functions to conduct away any charge which tends to accumulate in the covering layer. The conductive film thereby prevents a charge accumulation which would tend to discharge through and cause damage to the covering layer. The method is particularly useful for fabricating MOS and CMOS semiconductor devices.

15 Claims, 17 Drawing Figures

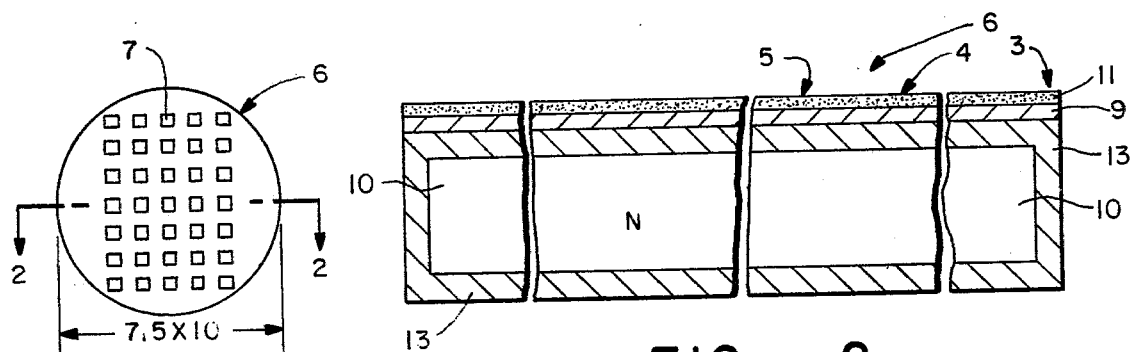
FIG.—1
FIG.—2
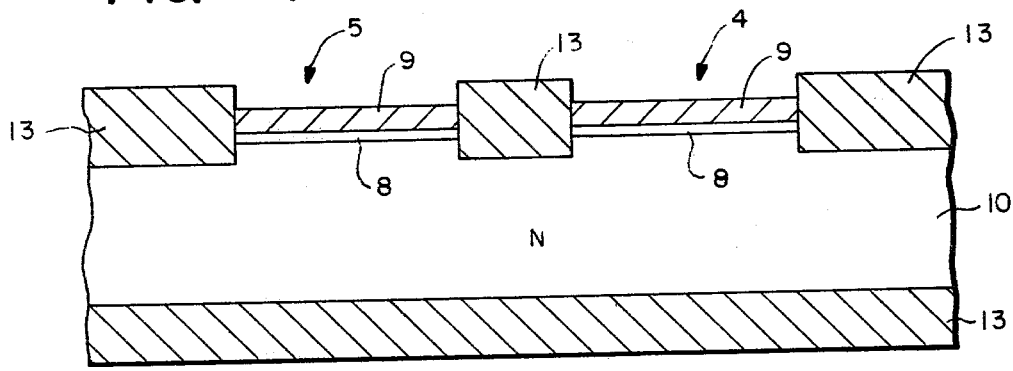
FIG.—3
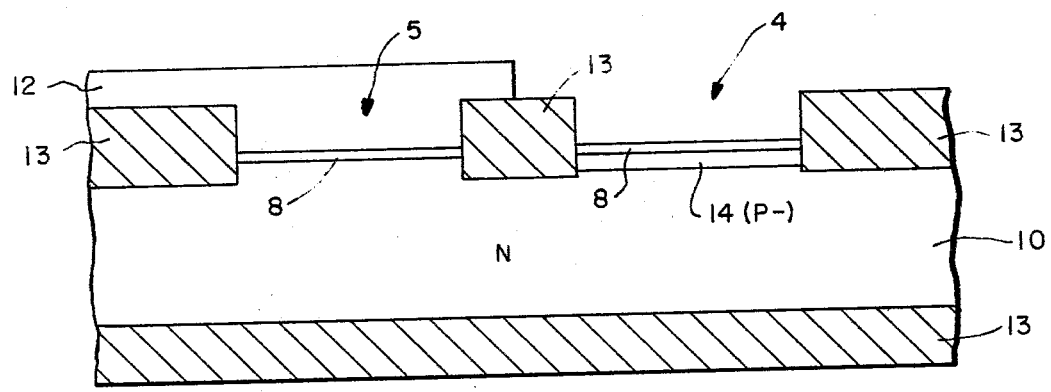
FIG.—4
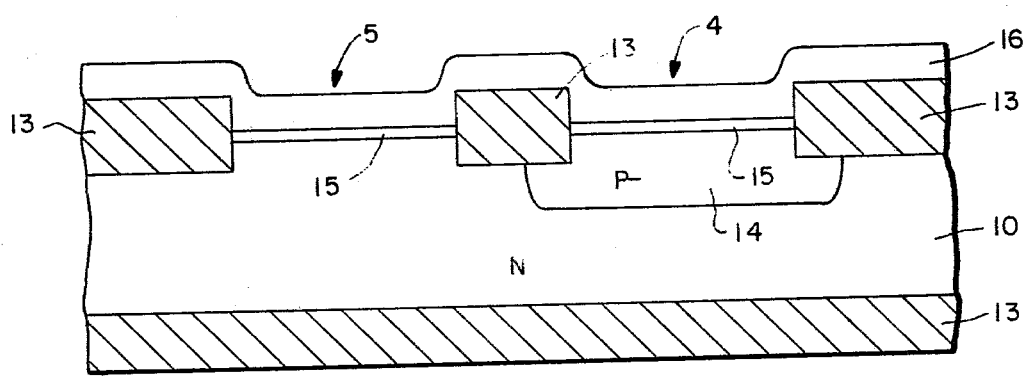
FIG.—5

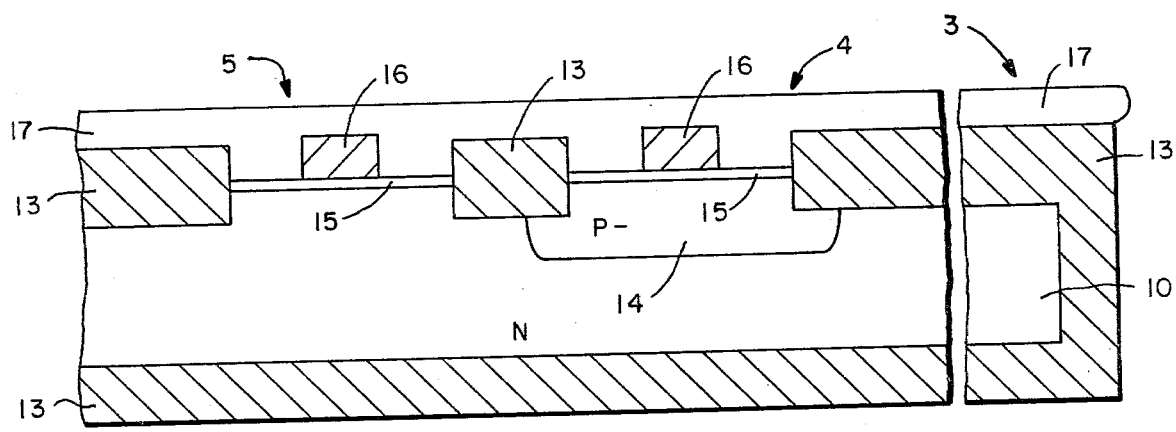
FIG.—6
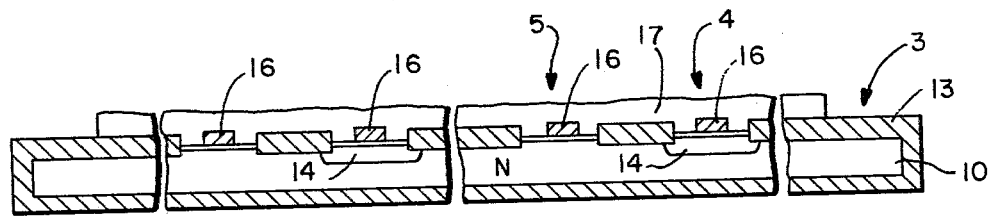
FIG.—7
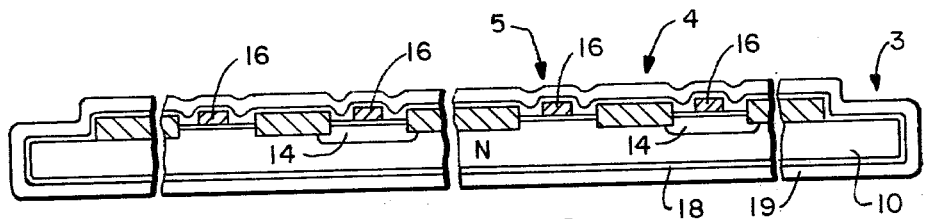
FIG.—8
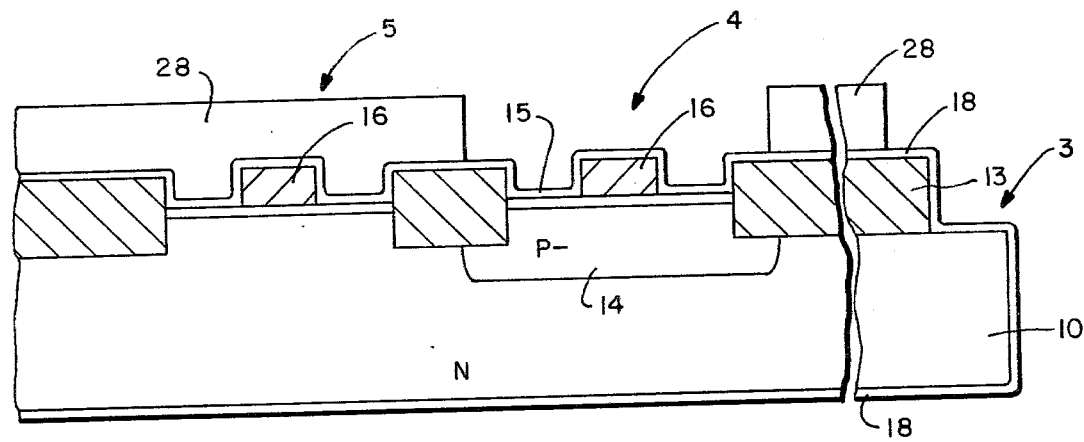
FIG.—9

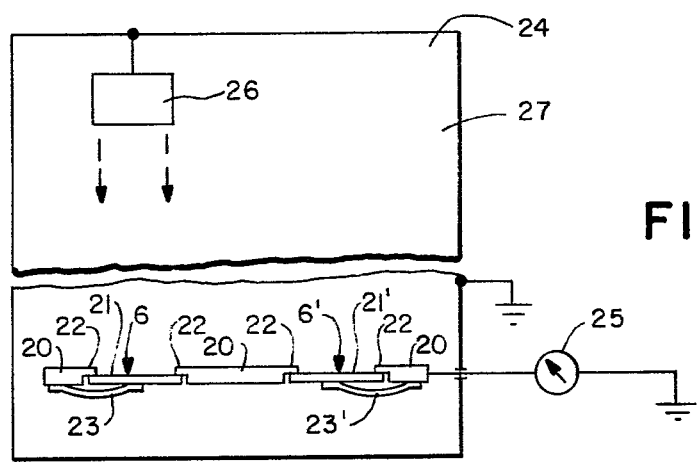
FIG.—10
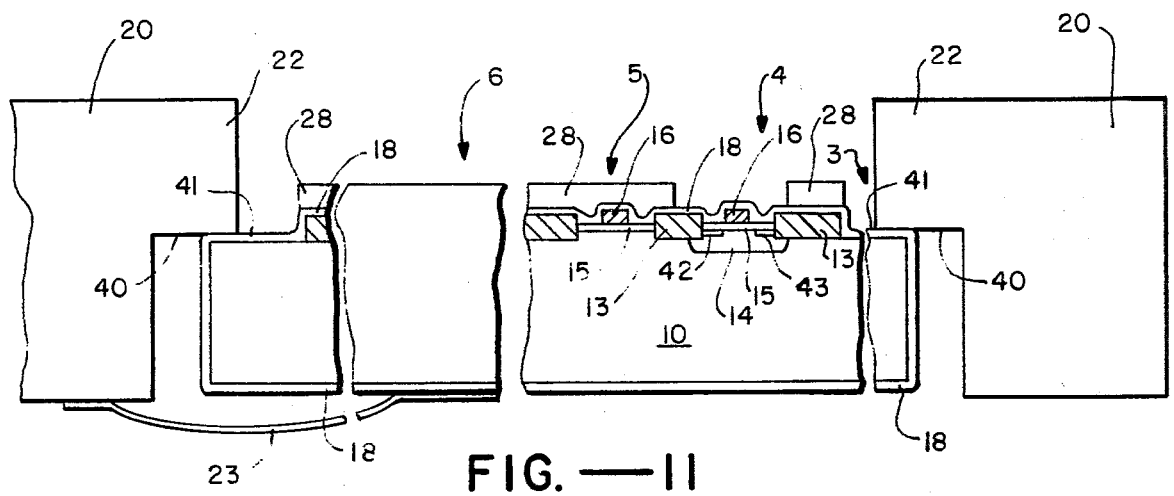
FIG.—11
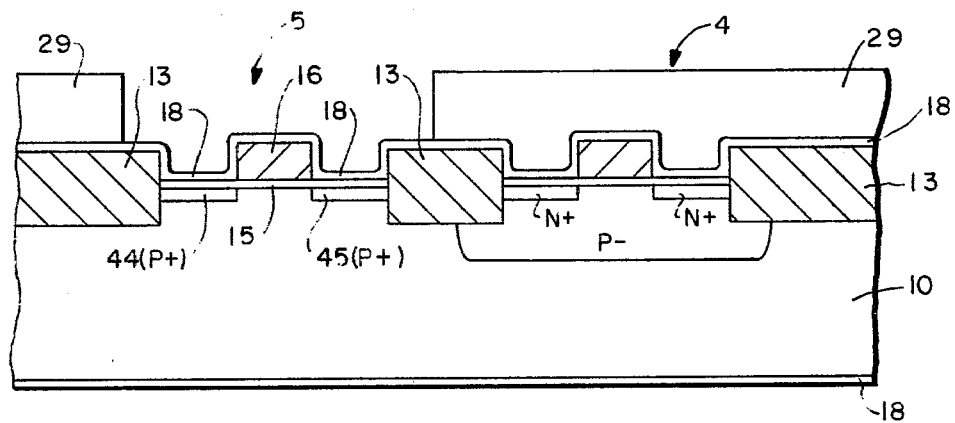
FIG.—12

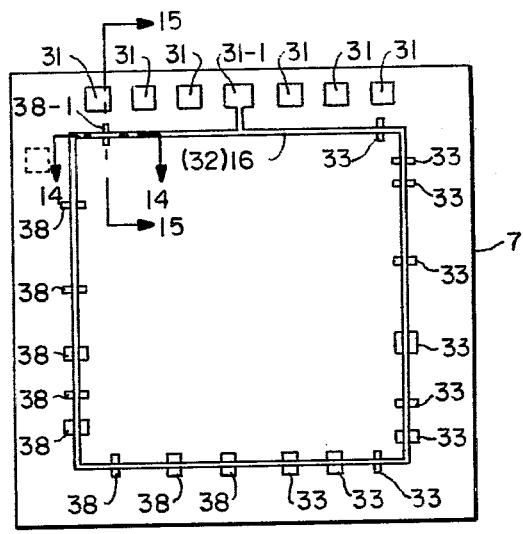
FIG.—13
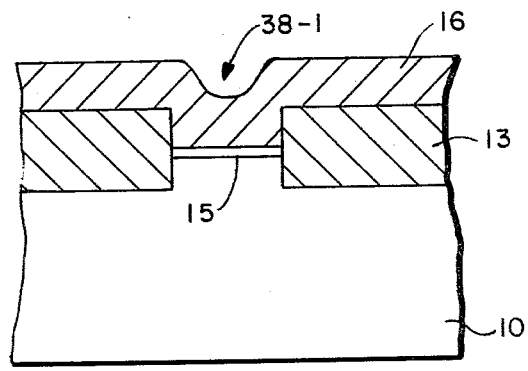
FIG.—14
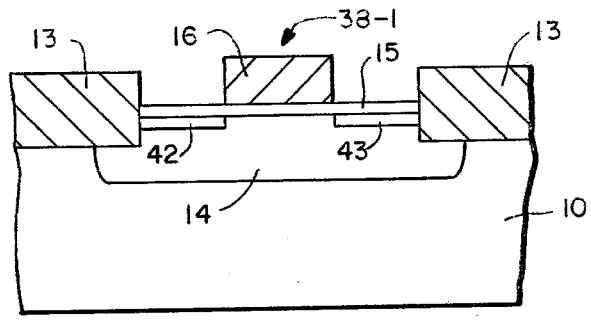
FIG.—15
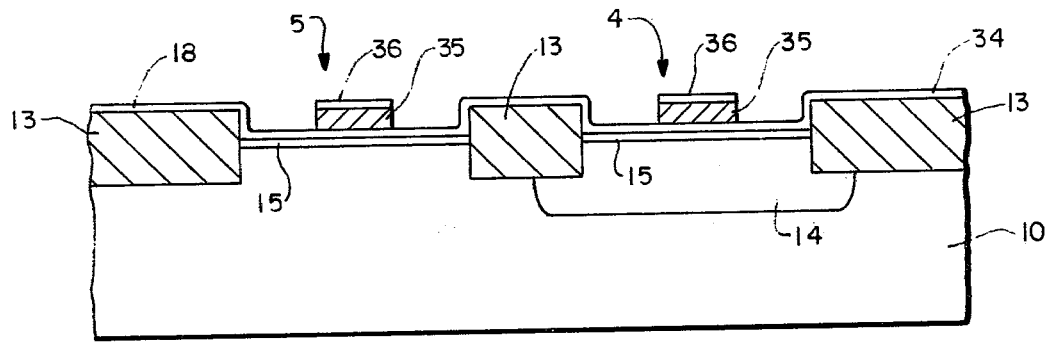
FIG.—16
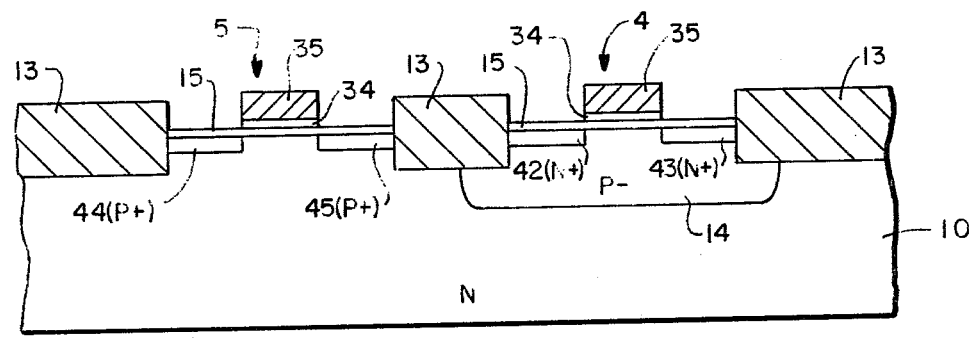
FIG.—17

ION IMPLANTATION METHOD

CROSS REFERENCE TO RELATED APPLICATIONS

DISCHARGE DEVICE AND METHOD FOR USE IN PROCESSING SEMICONDUCTOR DEVICES, Ser. No. 840,674, filed Oct. 11, 1977, invented by John J. Zasio and Michael W. Samuels, and assigned to the assignee of the present invention.

WAFER HOLDER WITH SPRING-LOADED WAFER-HOLDING MEANS, Ser. No. 845,496, filed Oct. 26, 1977, invented by Gabriel Zasio, and assigned to the assignee of the present invention.

BACKGROUND OF THE INVENTION

This invention relates to a method for implanting ionized particles into a material and more specifically to a method particularly suited for manufacturing insulated gate field effect semiconductor devices.

Ion implanation is a well-known method utilized in semiconductor and other fabrication processes. In general, charged particles are utilized to introduce atoms or molecules into a substrate material. The substrate is typically a semiconductor wafer formed of silicon or other material common in semiconductor processing. The materials to be injected by ion inplantation are typical dopants such as boron or phosphor. The dopants add impurities to the substrate. The dopant to be implanted into the substrate is charged and accelerated towards the semiconductor by a high-voltage. The ion distribution on the surface of the substrate is generally uniform. The density and the depth of the implanted ions is a function of the acceleration voltage and the ion dose. After ions of the dopant have been implantated, the atoms and molecules are usually activated by an annealing process at an elevated temperature.

Ion implantation is particularly useful in the fabrication of metal-oxide semiconductors (MOS) and complementary metal-oxide semiconductors (CMOS). The fabrication of CMOS devices conveniently uses ion implantation because CMOS devices require a number of different doping steps and such steps are more successfully performed with ion implantation. For example, CMOS devices typically utilize a boron implantation for P wells, a boron implantation for P-channel threshold voltage adjustment, a phosphorous implantation for N-channel transistors, and a boron implantation for P-channel transistors. Typical steps for CMOS devices are shown in the article entitled "A Fully Plasma Etched Ion Implanted CMOS Process", By: A. Aitken, R. G. Poulsen, A. T. P. MacArthur, J. J. White, *Technical Digest* 1976 *International Electron Device Meeting,* Copyright 1976 by the Institute of Electrical and Electronics Engineers, Incorporated.

While such CMOS ion implantation techniques are well-known, there is a need for improved steps particularly where high density semiconductor devices are to be fabricated.

The trend in the semiconductor field, of course, is to fabricate a greater number of elements per unit of area. That trend demands that the dimensions of semiconductor elements become smaller and smaller. For example, the thickness of the gate oxide layers in CMOS devices is typically 500 angstroms or less. These small dimensions permit relatively low threshold voltages in MOS devices and hence are frequently desirable.

The use of ion implanation with such relatively thin gate oxide layers has resulted in fabrication problems. The ion implantation process is used to form source and drain regions within the substrate. A thin gate oxide layer covers the surface of the substrate above the area where the source and drain regions are to be formed. The ion implantation to form the source and drain regions occurs through the oxide layer. Frequently, a silicon gate mask is employed over the thin gate oxide layer to separate the source and drain regions. Ions incident on the mask are stopped by the silicon gate material and tend to create a high electrostatic field. That electrostatic field tends to cause a voltage potential across the thin gate oxide layer. The strength of the electrostatic field is a direct function of the ion dose and is typically in the order of $10^4$ volts/centimeter. Such a voltage is sufficiently high to cause dielectric breakdown of the gate oxide and hence causes damage to the thin gate oxide layer.

The problem of damage to the gate oxide layer during ion implantation both hinders the obtaining of high yields and/or the obtaining of high densities.

In view of the above background of the invention, it is the object of the present invention to provide a process for ion implantation which is particularly useful in manufacturing semiconductor devices, such as MOS and CMOS devices, without causing gate oxide damage.

SUMMARY OF THE INVENTION

The present invention is a method of ion implantation. A substrate or other material which is to receive an ion implantation has a covering layer formed to receive at least some of the incident ions before they are implanted in the substrate. A conductive film is formed in contact with the covering layer. The substrate, the covering layer and the conducting layer are then subjected to incident ions. During the ion implantation, the conducting layer acting as a conductor tends to prevent any accumulated charge from forming as a result of the incident ions.

In accordance with one embodiment of the present invention, the conductive film has a thickness of several hundred angstroms so that the incident ions are implanted through the conductive layer without substantially altering the depth and dose of ions implanted into the substrate.

In accordance with one feature of the present invention, the thin conductive film is formed as a polycrystalline silicon layer.

In accordance with one embodiment of the present invention, an insulated-gate field-effect semiconductor device is formed. A semiconductor substrate is processed to establish source and drain regions by ion implantation through a thin insulating gate oxide layer. Prior to the source and drain ion implantation, a gate electrode is formed over the gate oxide layer to function as a mask between the source and drain regions during ion implantation. A thin conducting layer is deposited in contact with the gate oxide layer and the gate electrode in order to prevent charge accumulation during subsequent source and drain ion implantation. The ion implantation steps inject ions through both the gate oxide layer and the conducting layer to form the source and drain regions in the substrate. Unwanted charge accumulation in the gate electrode, which might occur due to the incident ion beam, tends to be eliminated by the thin conductive layer.

In accordance with another feature of the present invention, the polysilicon thin conductive layer is formed to prevent charge accumulation during ion implantation and thereafter the polysilicon layer is converted to a silicon dioxide insulating layer in a subsequent oxidizing step.

In accordance with another feature of the present invention, the thin conductive layer is processed to form of a multi-layered gate electrode structure.

In accordance with the above summary, the present invention achieves the objective of providing an ion implantation method for forming insulated-gate, field-effect semiconductor and other devices in which ions to be implanted are incident on layers covering the substrate which is to receive the implantation and in which the covering layers, such as gate oxide layers, are not damaged.

Additional objects and features of the invention will appear from the following description in which the preferred embodiments of the invention have been set forth in detail in conjunction with the drawings.

BRIEF DESCRIPTION OF THE DRAWINGS

FIG. 1 depicts a semiconductor wafer which is to be processed in accordance with the present invention.

FIG. 2 depicts a cross-sectional view of the partially processed wafer of FIG. 1.

FIG. 3 depicts a cross-sectional view of a portion of the FIG. 2 wafer which has been further processed to form a thick oxide layer over the entire surface of the wafer except in two regions in which mask layers remain where active devices are to be formed.

FIG. 4 depicts a cross-sectional view of the FIG. 3 section of the semiconductor wafer which has been further processed to remove the mask layers and to form a resist to mask one of the two active device regions and further processed to implant P- ions in the unmasked active device region.

FIG. 5 depicts a cross-sectional view of the FIG. 4 wafer section further processed to anneal the P− well, to remove the old and form a new gate oxide layer in both active device regions, and to form thin polysilicon conductive layer on the entire top surface.

FIG. 6 depicts the FIG. 5 wafer section and an end section of the wafer further processed to have the thin polysilicon layer selectively removed to form gate electrodes and thereafter further processed to form a photo-resist on the entire top surface.

FIG. 7 depicts a cross-sectional view of a wafer including the FIG. 6 wafer sections further processed to have the photo-resist selectively removed to provide a mask for removing unmasked areas of the wafer.

FIG. 8 depicts a cross-sectional view of the FIG. 7 wafer further processed with portions of the thick oxide layer and the resist removed and further processed by formation of first a polysilicon layer and second a phosphosilicate glass layer over the entire surface of the wafer.

FIG. 9 depicts a cross-sectional view of a section of FIG. 8 wafer further processed to remove the phosphorsilicate glass layer and further processed to form a selectively removed photo-resist over the top surface to provide access to one of the active device regions.

FIG. 10 depicts an ion implantation apparatus holding a plurality of wafers.

FIG. 11 depicts a cross-sectional view of a wafer, including a FIG. 9 wafer section, mechanically and electrically mounted in the support member of the FIG. 10 ion implantation apparatus where the wafer has been further processed to implant the N+ ions to form the source and drain regions for one of the active devices.

FIG. 12 depicts a cross-sectional view of a section of the wafer in FIG. 11 further processed to implant the P+ ions to form the source and drain regions for the other active device.

FIG. 13 depicts a top view of one test chip pattern which is typical of the thirty-five chips to be formed on the wafer of FIG. 1.

FIG. 14 depicts a cross-sectional view, taken along section line 14—14, of one partially processed transistor in the FIG. 13 chip.

FIG. 15 depicts a cross-sectional view, taken along section line 15—15 in FIG. 13, of the same transistor as depicted in FIG. 14.

FIG. 16 depicts a cross-sectional view of a partially processed wafer section which employs double-layer gates in accordance with an alternate embodiment of the present invention.

FIG. 17 depicts a cross-sectional view of the FIG. 16 wafer section further processed to show the source and drain regions formed by ion implantation in accordance with the present invention.

DETAILED DESCRIPTION

One embodiment of the present invention is described in connection with FIGS. 1 through 13.

In FIG. 1, a conventional semiconductor wafer 6 measures approximately 7.5 centimeters (7.5 times $10^{-2}$ m) in diameter. The wafer 6 is processed, in accordance with the present invention, to form a number of chip areas 7 where each chip area 7 is processed to include a number of active semiconductor devices. In one embodiment, each chip area 7 has dimensions of 1.5 by 1.4 millimeters and a total of thirty-five chips are formed on one wafer 6.

In FIG. 2, the partially processed wafer 6 of FIG. 1 is shown in a cross-sectional view taken along section line 2—2 of FIG. 1. In FIG. 2, the substrate 10 is formed of N-type silicon. The N region 10 is typically 500 microns ($5 \times 10^{-4}$ m) in thickness. The substrate 10 is covered with a silicon dioxide layer 8 which is typically 500 angstroms thick. The silicon dixoide layer is conventionally formed, for example by thermal growth. The top surface of the silicon dioxide layer 8 is covered with a silicon nitride layer 9. The silicon nitride layer 9 is conventionally formed and for example is grown by gaseous reaction in a reaction tube flowing a mixture of monosilane and ammonia to a thickness of approximately 1500 angstroms.

The silicon nitride layer 9 is covered by a conventional photo-resist layer 11. The photo-resist layer 11 is typically exposed to form a pattern where active devices, such as P-channel and N-channel transistors, are to be located. For purposes of explanation, the first region 4 and the second region 5 in FIG. 2 are shown to represent typical N-channel and P-channel active devices, respectively.

After the photo-resist layer 11 has been exposed the resist layer 11 is removed other than in the regions 4 and 5. After the photo-resist has been thus removed, the silicon nitride layer 9 is removed by a conventional plasma etching step except in the area beneath the regions 4 and 5. The plasma etching process does not remove the silicon dioxide layer 8. Thereafter, the remaining resist 11 in the regions 4 and 5 is removed leaving the silicon nitride layer 9 in the regions 4 and 5.

The silicon nitride layer 9 thus remaining acts as an oxidation mask. The wafer of FIG. 2 thus processed is placed in an oxidation furnace to grow a thick oxide layer of approximately 6,000 angstroms.

As shown in FIG. 3, a field oxide layer 13 is thus formed in all areas both on the top and bottom surfaces of the wafer except where the nitride mask 9 is present. The silicon nitride layer 9 in both the regions 4 and 5 of FIG. 3 is next removed by a conventional etching solution. After the etching, the wafer surface includes the thick silicon dioxide layer 13 and the thin silicon dioxide layer 8. Next, a conventional photo-resist layer is formed over the top surface of the silicon dioxide layers 13 and 8. The photo-resist is exposed to form a mask over region 5. As shown in FIG. 4, resist layer 12 remains as a mask over the region 5.

The wafer as processed in the manner indicated in FIG. 4 is placed in an ion implantation apparatus. Boron ions are implanted in the substrate 10 through the silicon dioxide layer 8 in the region 4. The implanted boron ions form a P-region 14.

After the ion implantation, the resist 12 of FIG. 4 is removed in a conventional manner and the thus processed wafer is placed in a heating furnace for annealing. The annealing process drives the implanted ions deeper into the substrate 10 causing the P-well 14 to be further formed as shown in FIG. 5.

The oxide layer 8 in the regions 4 and 5 are removed in a conventional manner such as by an etching solution containing hydrofluoric acid. After the oxide layer 8 has been removed, a new gate oxide layer 15 is carefully formed to a thickness of 500 angstroms using, for example, thermals oxidation with chlorine as an oxidizing gas. After formation of the oxide layer 15 in both the regions 4 and 5, the wafer is placed in a gaseous reaction tube. The reaction tube flows monosilane to form a polysilicon layer 16. The reaction tube is preferably maintained at a pressure of 2.2 Torr by a rotary pump to maintain a uniform thickness of the polycrystalline silicon layer 16. The polysilicon layer 16 is grown to a thickness of approximately 4,000 angstroms. The wafer thus processed is shown in FIG. 5.

In order to increase the conductivity of the polysilicon layer 16 in FIG. 5, the FIG. 5 wafer is placed in an ion implantor and phosphorous ions are injected into the polysilicon layer 16. The accelerating voltage on the ion implanting apparatus is 30,000 volts and a dose of $7 \times 10^{15}$ ions per square centimeter is achieved.

After ion implantation, annealing is carried out for 20 minutes in a furnace at 1,000 degrees centigrade. While an ion implantation step is desirable because of its simplicity, a conventional diffusion step may be employed to increase the conductivity of the polysilicon layer 16 in FIG. 5.

After the conductivity of the polysilicon layer 16 of FIG. 5 is increased by implantation and annealing, the polysilicon layer 16 is covered with a conventional photo-resist (not shown). The photo-resist is then exposed to define gates in a portion of the polycrystalline layer 16 over both the regions 4 and 5 and otherwise in the layer 16 as required for the interconnecting lines between gates. The non-exposed resist is removed in a conventional manner permitting access to portions of the polycrystalline layer 16. Except where protected by the remaining photo-resist, the layer 16 is etched by a conventional plasma etching step leaving the polycrystalline gates 16 over the gate oxide layers 15 as shown in FIG. 6. After removal of the polycrystalline layer 16 except in the gate region of FIG. 6, the remaining resist mask is removed using the same plasma apparatus.

Next, the wafer including the sections of FIG. 6 is covered with a photo-resist 17 on the top layer. The photo-resist 17 is exposed and a resist around the outer perimeter region 3 of the wafer is removed to a width of approximately 6 millimeters leaving a resist layer 17 only on the top surface of the wafer as shown in FIG. 7.

The FIG. 7 wafer is conventionally plasma etched to remove any of the polycrystalline silicon layer 16 which may be in the perimeter region 3 of the FIG. 7 wafer. Next, the exposed surface not covered by the resist 17 is processed by wet chemical etching to remove the relatively thick silicon dioxide layer 13. The layer 13 is removed both from the top surface in the perimeter region 3 and on the end and bottom surfaces of the FIG. 7 wafer. The resist 17 is then completely removed.

As shown in FIG. 8, a polycrystalline silicon layer 18 is formed on the entire surface of the wafer to a thickness of approximately 400 angstroms. The polycrystalline layer 18 is formed, for example, in a gaseous-reaction tube flowing monosilane at a pressure of 2.2 Torr using a rotary pump for maintaining uniform thickness over all the surface. In accordance with the present invention, the conductive layer 18 is formed to interconnect all of the otherwise electrically isolated silicon gates 16.

The polycrystalline conductive layer 18, in one embodiment, has its conductivity increased by including a doping material, such as phosphine, in the flowing gas during gaseous deposition. For example, the wafer processed to the state where the layer 18 is the outer surface placed in a reaction tube flowing monosilane and phosphine forming a phospho-silicate glass layer 19 of approximately 2,000 angstroms as shown in FIG. 8. The wafer shown in FIG. 8 is then placed in a furnace for annealing at a temperature of 1,000 degrees centigrade for 10 minutes. The phosphorous in the layer 19 therefore becomes diffused into the thin polycrystalline silicon layer 18. The sheet resistivity of the silicon layer 18 in the embodiment described has been measured as under 1,000 ohms per square. After the annealing diffusion, the layer 19 is completely removed, for example, by a buffered hydrogen fluoride acid.

After removal of the layer 19, a conventional photo-resist is formed over the top surface of the wafer. The resist is exposed and is processed to remove the resist from the region 4 and the perimeter region 3 (see FIG. 11). The wafer as thus processed is partially shown by the wafer section of FIG. 9. The wafer processed to the state indicated in FIG. 9 is placed in the ion implantation apparatus of FIG. 10.

In FIG. 10, a plurality of wafers, of which wafers 6 and 6' are typical, are mounted in the support member 20 through the openings 21 and 21', respectively, which are shown as typical. Member 20 is typically a good conductor such as aluminum. Each of the openings, as described in connection with opening 21, is defined by flange portions 22 of the support member 20. The wafer 6 is inserted from the bottom with the top surface facing upward toward the ion generator 26. The wafer 6 is held in place by the spring 23 which is movably attached to the support member 20 so as to allow the wafer 6 to be inserted into the opening. The ion current meter is connected between the support member 20 and ground. Ions are generated by the ion generator 26 and are accelerated by a voltage difference between the source and the wafer support member 20 toward the wafer 6. The ions are implanted into the exposed regions of wafer 6 and the electrical current generated is measured by the ion meter 25. The enclosure 27 is also grounded. The other wafers such as wafer 6' in member 20 may be moved to the position of wafer 6 at different times to receive an ion implantation in the same manner as wafer 6.

In FIG. 11, further details of the electrical and mechanical connection of the wafer 6 to the support member 20 are shown.

The flange 22 has a lower contacting surface 40. The wafer 6 has an upper surface 41 on the polycrystalline silicon layer 18 which is forced into electrical and mechanical contact with the surface of the flange 40. In this manner, the support member 20 is electrically connected to each of the gate regions 16 and also to the substrate region 10, through the conductive polycrystalline layer 18. Further mechanical and electrical connection is made between the polycrystalline layer 18 of the wafer 6 and the support 20 through the metal spring 23. The wafer 6 as thus connected is subjected to a phosphorous ion implantation in FIG. 10 apparatus.

In FIG. 10, the phosphorous ions are generated by the ion source 26. The acceleration voltage is typically set to 85,000 volts. The conductive layer 18, being relatively thin, has a negligable effect upon the incident ions as far as their penetration into the P-well 14 is concerned. The ions pass through the opening in the resist 28 through the polycrystalline layer 18 through the thin oxide layer 15 and into the P-well 14. The polycrystalline silicon gate 16 acts as a mask to the phosphorous ions so that source and drain regions 42 and 43 appear in the P-well 14 beneath the openings on either side of the gate mask 16. During the ion implantation, in accordance with the present invention, the gate mask 16, the silicon dioxide layers 15 and the N substrate 10 all tend to be maintained at the same voltage potential due to the conductivity of the polycrystalline conductive layer 18. In this manner, voltage discharges through the thin gate oxide 15 is suppressed.

After the phosphorous ion implantation has occured as indicated in FIG. 11, the thus processed wafer is removed from the ion implantation apparatus and the remaining resist layer 28 is removed in a conventional manner. A new photo-resist mask 29 is then covered on the thus processed wafer surface which then is selectively exposed and removed in the region 5 as shown in FIG. 12. Although not shown in FIG. 12, the resist 29 is also removed in the perimeter region 3 near the edge of the wafer 6 leaving the top surface of the conductive layer 18 exposed. In this manner, the wafer processed as indicated by the wafer section of FIG. 12 is again inserted into the support member 20 with contact between the upper surface 41 of the conductive layer 18 and the surface 40 of the flange 22. The wafer thus mounted undergoes boron ion implantation. During the boron implantation, the conductive layer 18 is in good electrical contact with the support member 20. The boron implantation is carried out under the condition of an accelerating voltage of 30,000 volts and with an ion dose of $1.5 \times 10^{15}$ ions per square centimeter. As indicated in FIG. 12, the P+ ion injection occurs through the conductive layer 18 and the thin gate oxide layer 15 into the N substrate 10 in the region 5 on either side of the polycrystalline gate 16. The polycrystalline gate 16 and the thick oxide layer 13 act as a mask for the source and drain P+ regions 44 and 45. During the ion implantation, the conductive region 18 electrically connects the isolated gate polycrystalline silicon layer 16, the thick oxide layers 13 and the substrate 10 thus preventing any accumualted charge from causing an arcing across or through the thin oxide layer 15.

After the ion implantation as indicated in FIG. 12, the resist 29 is completely removed and the thus processed wafer is annealed to distribute and activate the source and drain phosphorous and boron ions. In accordance with one embodiment, the annealing is done in an oxidizing atmosphere to convert the thin silicon layer 18 into a silicon dioxide layer. Alternatively, the thin silicon layer 18 is removed by conventional plasma etching. Since only a short etching time is required to remove the layer 18, the etching step does not significantly change the shape and thickness of the underlying silicon gate 16. However, the oxidizing step is frequently preferred where further processing includes plasma etching of via holes since the remaining thin oxide layer then acts as an etch stop.

Experimental Results

The results of experiments carried out in accordance with the present invention have established that no gate shorts occur through the thin gate oxide layer by either the phosphorous or boron ion implantation. A voltage potential of nominally 40 volts has been measured between the substrate 10 and the gate electrode 16 under a standard 100 nanoampere current thus confirming the absence of any shorts. By way of contrast, when the present invention is not employed, it has been found that gate shorts across or through the thin oxide layer 15 frequently occur as a result of the ion implantation steps. In the absence of the thin conductive layer 18 in accordance with the present invention, ions which are stopped by the gate electrode 16 cause an electric field to be accumulated. It is estimated that the resulting electric field across the thin gate insulating layer 15 is over $10^4$ volts per centimeter. Such a voltage field frequently causes dielectric electrical breakdown of the layer 15. Such an electrical field is created during the ion implantation having a dose of about $10^{15}$ ions per square centimeter in the absence of surface leakage. A dose of $10^{15}$ ions per square centimeter is a typical value employed for the impurities phosphorous and boron in MOS fabrication.

It was observed, however, that the estimated high voltage did not necessarily cause gate shorts in all configurations. The gate short primarily occured for transistor structures having a relatively long gate pattern.

More specifically, the actual gate short is found to occur, in the absence of the present invention as a function of the total quantity of ions injected into the gate. It was further found that there are two different types of damage to the thin oxide gate layer. One type of damage is visually observable and hence characterized as a macro defect. The other type of defect is visually unobservable and hence is characterized as a micro defect. The macro damage defect is observed under a microscope as a spot of approximately one micron in diameter. On the periphery of the spot there is an appearance of molten material which appears to have been moved from the center of the spot. The macro defect, of course, prevents the oxide layer from acting as an insulator and hence acts as a short circuit between the materials on either side of the thin oxide layer.

In a similar manner, a micro defect also causes a catastrophic failure of the device in that a short circuit exists between the materials on either side of the thin oxide layer. The micro defect, although it is invisible under a microscope, is also believed to be caused by the oxide breakdown resulting form voltage discharges caused during the ion implantation in the absence of the present invention.

When the thin conductive film such as the polycrystalline silicon layer 18 as previously described connects the isolated floating gates to a common potential level, neither the macro defect nor the micro defect of the gate oxide layer has been observed.

In one run, a plurality of test wafers were processed in accordance with the present invention as explained in connection with FIGS. 1 through 13. Each wafer included thirty-five test chips where each such chip included a chip pattern as shown in FIG. 13.

In FIG. 13, the surface pattern of the single chip 30 is shown to include 10 N-channel transistors 38 and 10 P-channel transistors 33 of different sizes. The N-channel transistors 38 in FIG. 14 are generally of the type formed in the region 5 in FIGS. 1 through 13 and the P-channel transistors in FIG. 14 are generally of the type formed in the region 4 of FIGS. 1 through 13.

In FIG. 13, the chip 30 includes a pattern for 10 N-channel transistors 38 and for 10 P-channel transistors 33 of various different sizes. The chip 30 has a pattern for a plurality of terminal patterns 31 around the periphery of the chip 30. A silicon gate 32 is provided to connect the gates of all of the transistors in common.

In FIG. 14, a cross-sectional view of the transistor area 38-1 is shown as taken along the section line 14—14 of FIG. 13. FIG. 14 shows the state of transistor 38-1 after processing in the manner described in connection with FIGS. 1 through 7. Additionally, the thick oxide layer 13 has been removed from the backside of the wafer 6 leaving the N-type substrate 10 fully exposed.

In FIG. 15, a cross-sectional view of the transistor 38-1 processed to the same state as FIG. 14 is shown taken along the section line 15–15 of FIG. 13.

With the chip pattern of FIG. 13 having all of the transistors 33 and 38 processed to the state indicated in FIGS. 14 and 15, the silicon oxide gate layers 15 were tested. The gate layers were tested by conducting 400 nanoamperes between the terminal 31-1 and the substrate 10. In order to make the test, the wafer including the test chip of FIG. 13 is placed with a constant current source connected between terminal 31-1 and the substrate 10. The terminal 31-1 is more positive with the current established at 100 nanoamps, the voltage between the terminal 31-1 and the substrate 10 is measured. If any one of the gate oxide layers is shorted, then the voltage measured is relatively low. If the gate oxide layers are not shorted then a nominal voltage of about 40 volts is measured.

In the following TABLE I, the test results for each of thirty-five chips on one wafer, processed as indicated in FIGS. 14 and 15 is shown. Each entry in TABLE I is in volts and each entry corresponds to the voltage measured between the gate electrode 31-1 and the substrate 10 at a current of 400 nanoamps for one chip. The measurements in TABLE I are indicated in terms of their row and column position. For example, the chip located in row 1 and column 1, that is chip (1,1), measured a voltage of 39.9 volts. Such a measurement indicates that the thin gate oxide layer for all of the transistors in the chip pattern of the FIG. 13 type processed to the point indicated in FIGS. 14 and 15 did not have a short circuit.

In TABLE I, the chip (5,1) only measured 7.0 volts indicating that a short existed. In a similar manner, the chips (7,1), (4,4), (6,4), (3,5), and (5,5) all had low voltages indicating that a short existed on those chips.

In TABLE I, the chip (4,2) measures a −108.8 volts which is an abnormality probably resulting from misplacement of the meter test probe.

In TABLE II, a second wafer again having thirty-five chips arrayed in seven rows and five columns was processed to the point indicated in FIGS. 14 and 15. Again voltage measurements were made under a 100 nanoampere constant current. In TABLE II, the chips (3,1), (4,1), (7,1), (3,2), (6,2), (1,3), (4,4), (7,4), (3,5) and (7,5) all had a low voltage indicating a short.

TABLE I (Wafer 1)

| Row | COL 1 | 2 | 3 | 4 | 5 |
|---|---|---|---|---|---|
| 1 | 39.9 | 40.3 | 40.8 | 39.3 | 38.9 |
| 2 | 40.4 | 41.0 | 40.2 | 40.3 | 39.0 |
| 3 | 41.2 | 41.2 | 41.2 | 40.5 | 5.1 |
| 4 | 40.7 | −108.8 | 40.7 | 6.2 | 40.7 |
| 5 | 7.0 | 42.0 | 41.8 | 40.8 | 5.2 |
| 6 | 41.6 | 41.3 | 41.6 | 6.9 | 40.4 |
| 7 | 6.9 | 41.2 | 41.9 | 40.2 | 40.1 |

TABLE II (Wafer 2)

| Row | COL 1 | 2 | 3 | 4 | 5 |
|---|---|---|---|---|---|
| 1 | 38.4 | 39.0 | 5.7 | 38.4 | 41.3 |
| 2 | 38.8 | 39.3 | 39.6 | 39.6 | 39.2 |
| 3 | 6.3 | 7.2 | 39.5 | 39.5 | 3.6 |
| 4 | 8.9 | 40.0 | 39.5 | 8.0 | 39.3 |
| 5 | 6.8 | 39.2 | 39.5 | 39.4 | 39.2 |
| 6 | 38.7 | 5.6 | 39.2 | 38.6 | 39.0 |
| 7 | 6.5 | 38.7 | 40.7 | 6.5 | 0.8 |

After the measurements were taken in connection with the wafers of TABLE I and TABLE II, the wafers were further processed in accordance with the present invention as described in connection with FIGS. 8 through 12. After the ion implantation of both boron and phosphors to establish the source and drain regions for the transistors 33 and 38, the same chips for both the TABLE I and TABLE II wafers were again tested. A 100 nanoamppere current was conducted through the gate regions to the substrate.

In TABLE III, the measured voltages for the thirty-five chips corresponding to the TABLE I measurements are shown. Similarly, the TABLE IV measurements are for the corresponding thirty-five chips of TABLE II.

A comparison of TABLES I and II with TABLES III and IV reveals that the same chips on each wafer have the low voltages and that none of the chips with acceptable voltage levels in TABLE I and II have unacceptable levels in TABLE III and IV. The test data demonstrates that the ion implantation steps of the present invention produced a 100% yield. Note that the wafer (4,2) in TABLE III measured 40.2 volts whereas the same wafer measured −108.8 volts in TABLE I. The TABLE II measurement of 40.2 volts confirms that the measurment for chip (4,2) in TABLE I was probably a test probe error.

TABLE III (Wafer 1)

| Row | COL 1 | 2 | 3 | 4 | 5 |
| --- | --- | --- | --- | --- | --- |
| 1 | 39.1 | 39.6 | 39.5 | 40.3 | 39.9 |
| 2 | 39.6 | 41.5 | 39.6 | 40.8 | 40.0 |
| 3 | 40.2 | 40.7 | 40.7 | 39.8 | 0 |
| 4 | 40.2 | 40.2 | 40.0 | 0 | 41.9 |
| 5 | 0 | 41.6 | 40.7 | 40.2 | 0 |
| 6 | 42.5 | 40.9 | 40.7 | 0.5 | 39.8 |
| 7 | 0 | 41.2 | 41.1 | 39.6 | 40.4 |

TABLE IV (Wafer 2)

| Row | COL 1 | 2 | 3 | 4 | 5 |
| --- | --- | --- | --- | --- | --- |
| 1 | 40.1 | 41.0 | 2.1 | 40.0 | 40.5 |
| 2 | 40.3 | 39.8 | 39.8 | 38.2 | 40.4 |
| 3 | 4.2 | 0.2 | 39.7 | 40.0 | 0 |
| 4 | 0 | 40.2 | 39.7 | 0 | 40.0 |
| 5 | 0 | 39.6 | 40.0 | 39.8 | 39.7 |
| 6 | 39.4 | 0.5 | 39.5 | 39.3 | 39.3 |
| 7 | 0 | 39.2 | 40.3 | 0 | 0 |

While the above-described test data indicates a 100% yield for the ion implantation steps for source and drain regions similar tests without using the conductive layer in accordance with the present invention provided a yield of only 3%. Accordingly, the present invention provides a dramatic increase in the yield associated with the ion implantation steps for source and drain regions in MOS devices.

While the present invention has been described with respect to a single layered gate structure such as gate layer 16 in FIGS. 1 through 15, multilayered gates in accordance with the present invention are possible.

Referring to FIG. 16, such a multilayered gate structure is shown. The structure of FIG. 16 is obtained by the following method. The processing steps as previously described in connection with FIGS. 1 through 4 are repeated. After the oxide layer 8 of FIG. 4 has been removed and the P- region has been annealed to establish the P- well 14, the thin oxide layer 15 is formed as shown in FIG. 16 using steps previously described. After formation of the oxide layer 15, as shown in FIG. 16, a polycrystalline silicon layer 34 doped with phosphors is formed, for example, by the gaseous reaction previously described, on the entire wafer surface to a thickness of approximately 400 angstroms. Next, a metal layer is deposited over the entire surface of the polycrystalline layer to a thickness of approximately 2,000 angstroms. The metal layer is preferrably a refractory metal such as molybdenum. A conventional deposition technique is employed. Next, a second polycrystalline silicon layer 36 is deposited on the entire surface of the layer 35. Next, a photo-resist layer is coated over the second polycrystalline silicon layer. The photo-resist is exposed in a conventional manner and the exposed portion of the resist is removed to provide access to the polycrystalline silicon layer except where the gate is to be formed. The portion of the second polycrystalline silicon layer not covered by the resist is etched away by a conventional plasma etching to provide selective access to the molybdenum layer beneath. The molybdenum layer thus exposed is in turn etched by a conventional chemical etching solution such as nitric acid. The resulting structure is shown in FIG. 16 where the layer 35 is molybdenum and the layer 36 is the second polycrystalline silicon layer.

The structure of FIG. 16 is then ready for the source and drain ion implantation both for the P-channel transistor and the N-channel transistor in the manner described in connection with FIGS. 9 through 12. During the ion implantation process, the conductive layer 34 in FIG. 15 contacts the support 20 in FIG. 10 in the manner indicated in FIG. 11 for the layer 18. In this manner, the isolated gate regions 35 are maintained at a common potential and hence do not cause a voltage discharge across or through the gate oxide layer 15.

After the ion implantation is carried out in the manner described in connection with FIGS. 9 through 12, the polycrystalline gate layer 34 is removed except in the region under the molybdenum electrode layer 35 by chemical etching. Alternatively, the gate layer 34 may be converted to silicon dioxide. The wafer after etching is shown in FIG. 17. The multilayered gate is formed by the lower layer 34 of conductive polycrystalline silicon and the upper layer 35 of molybdenum.

The use of the multilayered gate structure as indicated in FIG. 17 is particularly desirable when relatively long gate connections, like the gate 32 in FIG. 13, is employed. The upper layer 35 being formed of a metal has a higher conductivity than the lower layer 34. In this manner, the overall conductivity of the gate layer is reduced thereby reducing delay time in interconnections.

While the invention has been particularly shown and described with reference to preferred embodiments thereof, it will be understood by those skilled in the art that the foregoing and other changes in form and detail may be made therein without departing from the spirit and scope of the invention.

What is claimed is:

1. A process for implanting ions into a semiconductor body comprising the steps of:
    forming an insulating layer on said body,
    forming a conductive layer covering said insulating layer,
    forming a first mask on said conductive layer to define a first region,
    supporting said body by supporting means in an ion implantation apparatus with said conductive layer in electrical contact with said supporting means, said supporting means connected to conduct current from said conductive layer,
    implanting a first type of ions through said insulating layer and said conductive layer into said body in said first region with said conductive layer functioning to conduct ion-generated current to said supporting means and thereby to reduce the build-up of a voltage across the insulating layer,
    forming a second mask on said conductive layer to define a second region,
    supporting said body by supporting means in an ion implantation apparatus with said conductive layer in electrical contact with said supporting means, said supporting means connected to conduct current from said conductive layer,
    implanting a second type of ions through said insulating layer and said conductive layer into said body in said second region with said conductive layer functioning to conduct ion-generated current to said supporting means and thereby to reduce the build-up of a voltage across the insulating layer, processing said conductive layer after said step of implanting a second type of ions to cause at least portions of said conductive layer to be nonconducting.

2. The process of claim 1 including, after said step of forming an insulating layer, the step of forming a conductive electrode having a limited area on said insulating layer and wherein said step of forming a first mask is performed to include said limited area within said first region.

3. In a process for manufacturing an insulatedgate field-effect semiconductor device, the steps of:
   forming a number of openings in a thick insulating layer on an N-type semiconductor body to define a number of discrete regions, one at each opening,
   forming a silicon dioxide thin insulating layer with a thickness of up to approximately 500 angstroms over each of said discrete regions,
   forming conductive electrodes on said thin insulating layer within a portion of each of said discrete regions,
   forming a thin conductive layer covering said thin insulating layer and in contact with each of said conductive electrodes,
   forming a first mask on said thin conductive layer exposing a first one of said regions above the N-type body, and portions of said conductive layer,
   supporting said body by supporting means in an ion implantation apparatus with said conductive layer in electrical contact with said supporting means,
   implanting a first type of ions through said insulating layer and said thin conductive layer into said body to form a source and drain for one device in said first one of said regions with said conductive layer functioning to reduce the build-up of a voltage across said thin insulating layer,
   forming a second mask on said conductive layer exposing a second one of said regions above one of said P-wells,
   supporting said body by supporting means in an ion implantation apparatus with said conductive layer in electrical contact with said supporting means,
   implanting a second type of ions through said insulating layer into said one of said P-wells to form a source and drain for another device in said second one of said regions with said conductive layer functioning to reduce the build-up of a voltage across said thin insulating layer, and
   removing said thin conductive layer.

4. The process of claim 3 including, after said step of implanting a second type of ions, a single step of annealing said semiconductor substrate to distribute and activate said source and drain ions of said one device and said another device.

5. In a process for manufacturing an insulated-gate field-effect device, the steps of:
   forming a relatively thick field insulating layer on a surface of a semiconductor substrate of one conductivity type,
   forming a relatively thin gate insulating layer at spaced surface regions of said semiconductor substrate,
   forming separated gate electrodes on said gate insulating layer, at least one of said gate electrodes being electrically floating,
   forming a thin conductive layer convering said surface of said semiconductor substrate, said conductive layer forming electrical contact with said gate electrodes,
   supporting said semiconductor substrate by supporting means in an ion implantation apparatus with said conductive layer in electrical contact with said supporting means, said supporting means connected to conduct current from said conductive layer,
   implanting impurity ions of opposite conductivity type to said one conductivity type through said conductive layer and said insulating layer into said semiconductor substrate to form source and drain regions of said insulated-gate field-effect device, and
   removing said conductive layer after said step of implanting impurity ions to remove said electrical contact with said gate electrodes.

6. In the process of claim 5 wherein said step of forming a relatively thin gate insulating layer produces an insulating layer with a thickness of up to approximately 500 angstroms.

7. In the process of claim 5 wherein said step of forming a thin conductive layer is performed to form said conductive layer as a polycrystalline semiconductor layer.

8. In a process for manufacturing an insulated-gate field-effect device, the steps of:
   forming a relatively thick field insulating layer on a surface of a semiconductor substrate of one conductivity type,
   forming a relatively thin gate insulating layer at spaced surface regions of said semiconductor substrate,
   forming separated gate electrodes on said gate insulating layer, at least one of said gate electrodes being electrically floating,
   forming a thin conductive layer covering said surface of said semiconductor substrate, said conductive layer forming electrical contact with said gate electrodes,
   supporting said semiconductor substrate by supporting means in an ion implantation apparatus with said conductive layer in electrical contact with said supporting means, said supporting means connected to conduct current from said conductive layer,
   implanting impurity ions of opposite conductivity type to said one conductivity type through said conductive layer and said insulating layer into said semiconductor substrate to form source and drain regions of said insulated-gate field-effect device, and
   processing said conductive layer to convert portions of said conductive layer between said gate electrodes into an insulating oxide layer.

9. In the process of claim 8 wherein said step of processing said conductive layer is performed after said step of implanting impurity ions by annealing in an oxidizing atmosphere.

10. In a process for manufacturing an insulated-gate field-effect device, the steps of:
   forming a relatively thick field insulating layer on a surface of a semicondutor substrate of one conductivity type, said thick field insulating layer having openings to said surface in spaced regions,
   forming a relatively thin gate insulating layer on said surface in said regions, forming a first polycrystalline gate electrode layer over said surface in contact with said relatively thick field insulating layer and said thin insulating layer, forming separated second gate electrodes in said regions on said first gate electrode layer whereby said first gate electrode layer makes electrical contact among said second gate electrodes, supporting said semiconductor substrate by supporting means in an ion implantation apparatus with said first gate electrode layer in electrical contact with said supporting means, implanting impurity ions of opposite conductivity type to said one conductivitry type through said first gate electrode layer and said gate insulating layer to form source and drain regions of said insulated-gate field effect device, and removing said first gate electrode layer between said second gate electrodes to remove said electrical contact among said second gate electrodes.

11. In the process of claim 10 wherein said step of forming a first gate electrode layer is performed to form said first gate electrode layer as a polycrystalline semiconductor layer.

12. In the process of claim 11 after the step of forming a first gate electrode layer as a polycrystalline layer, the step of processing said polycrystalline layer to increase the conductivity of the polycrystalline layer.

13. In the process of claim 11 wherein said step of forming second gate electrodes is performed to form said second gate electrodes as a refractory metal layer.

14. In a process for manufacturing an insulated-gate field-effect device, the steps of:

forming a relatively thick field insulating layer on a surface of a semiconductor substrate of one conductivity type, said thick field insulating layer having openings to said surface in spaced regions, forming a relatively thin gate insulating layer on said surface in said regions, forming a first gate electrode layer over said surface in contact with said relatively thick field insulating layer and said thin insulating layer, forming separated second gate electrodes in said regions on said first gate electrode layer whereby said first gate electrode layer makes electrical contact among said second gate electrodes, supporting said semiconductor substrate by supporting means in an ion implantation apparatus with said first gate electrode layer in electrical contact with said supporting means, implanting impurity ions of opposite conductivity type to said one conductivitry type through said first gate electrode layer and said gate insulating layer to form source and drain regions of said insulated-gate field effect device, removing said first gate electrode layer between said second gate electrodes to remove said electrical contact among said second gate electrodes, and annealing said first gate electrode layer in an oxidizing atmosphere except in the regions under said second gate electrodes.

15. In a process for manufacturing an insulated-gate field-effect device, the steps of:

forming a relatively thick field insulating layer on a surface of a semiconductor substrate of one conductivity type, said thick field insulating layer having openings to said surface in spaced regions, forming a relatively thin gate insulating layer on said surface in said regions, forming a first gate electrode layer over said surface in contact with said relatively thick field insulating layer and said thin insulating layer, and in electrical contact with said substrate in a location other than in said regions, forming separated second gate electrodes in said regions on said first gate electrode layer whereby said first gate electrode layer makes electrical contact among said second gate electrodes, supporting said semiconductor substrate by supporting means in an ion implantation apparatus with said first gate electrode layer in electrical contact with said supporting means, whereby said second gate electrodes and said substrate are all connected electrically in common, said supporting means electrically connected to conduct ion-generated current from said first gate electrode layer and said substrate, implanting impurity ions of opposite conductivity type to said one conductivitry type through said first gate electrode layer and said gate insulating layer to form source and drain regions of said insulated-gate field effect device, and removing said first gate electrode layer between said second gate electrodes to remove said electrical contact among said second gate electrodes and said electrical contact with said substrate.

* * * * *